(12) United States Patent
Tahk et al.

(10) Patent No.: US 8,587,485 B2
(45) Date of Patent: Nov. 19, 2013

(54) PORTABLE TERMINAL

(75) Inventors: Ui-Soo Tahk, Goyang (KR); Kyoung-Hwa Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 421 days.

(21) Appl. No.: 12/797,421

(22) Filed: Jun. 9, 2010

(65) Prior Publication Data
US 2010/0331050 A1 Dec. 30, 2010

(30) Foreign Application Priority Data

Jun. 25, 2009 (KR) ........................ 10-2009-0057253

(51) Int. Cl.
*H01Q 1/24* (2006.01)
(52) U.S. Cl.
USPC ......... 343/702; 343/906; 455/566; 455/575.1
(58) Field of Classification Search
USPC ......... 343/702, 906, 700 MS; 455/566, 575.1
See application file for complete search history.

(56) References Cited

U.S. PATENT DOCUMENTS

| 6,337,663 | B1 | 1/2002 | Chiang |
| 2005/0017902 | A1 | 1/2005 | Oyama et al. |
| 2006/0132366 | A1 * | 6/2006 | Seol et al. ..................... 343/702 |
| 2006/0139218 | A1 * | 6/2006 | Jang ............................. 343/702 |
| 2006/0290591 | A1 * | 12/2006 | Nilsson et al. ................ 343/906 |
| 2009/0002244 | A1 * | 1/2009 | Woo .............................. 343/702 |
| 2009/0115671 | A1 | 5/2009 | Ishihara |

OTHER PUBLICATIONS

European Search Report dated Nov. 2, 2010 for corresponding European Application Serial No. 10005657.1.

* cited by examiner

*Primary Examiner* — Dieu H Duong
(74) *Attorney, Agent, or Firm* — KED & Associates LLP

(57) ABSTRACT

A portable terminal includes a circuit board having edge and component mounting surfaces. The edge surface includes a first contact terminal and an antenna includes a second contact terminal. The component mounting surface is at least substantially parallel with a display screen of the terminal and the edge surface is at least substantially perpendicular to the display screen. The first and second contact terminals are coupled together to establish an electrical connection between the circuit board and antenna when the antenna and edge surface are mounted in parallel to one another within a housing of the terminal.

21 Claims, 10 Drawing Sheets

PORTABLE TERMINAL

CROSS-REFERENCE TO RELATED APPLICATION

This application claims priority under 35 USC §119 to Korean Application No. 10-2009-0057253, filed on Jun. 25, 2009, the contents of which are incorporated herein by reference.

BACKGROUND

1. Field

One or more embodiments described herein relate to a portable terminal.

2. Background

Personal computers, notebook computers, portable phones, and other portable terminals have been developed to perform video and voice call communications, still or moving image capturing using a camera, voice storing, music file reproducing through a speaker system, and image and/or video displaying. These terminals also allow users to play games and view television programs by receiving broadcast or multicast signals.

Improvements in these terminals have required commensurate software and hardware upgrades. In providing these upgrades, maximizing internal space within the terminal is a goal, especially as terminals become thinner and smaller. These upgrades should be made without compromising communication quality, which is, of course, the foremost concern in portable terminal design.

DETAILED DESCRIPTION

Communication terminals come in various forms including portable terminals and fixed terminals. Examples of portable terminals include portable phones, smart phones, notebook or other types of portable computers, digital broadcasting terminals, Personal Digital Assistants (PDAs), Portable Multimedia Players (PMPs), and navigation systems. Fixed terminals include digital televisions (TVs), desktop computers, and well as others. The embodiments described herein may relate to fixed or portable terminals.

Figure 1:
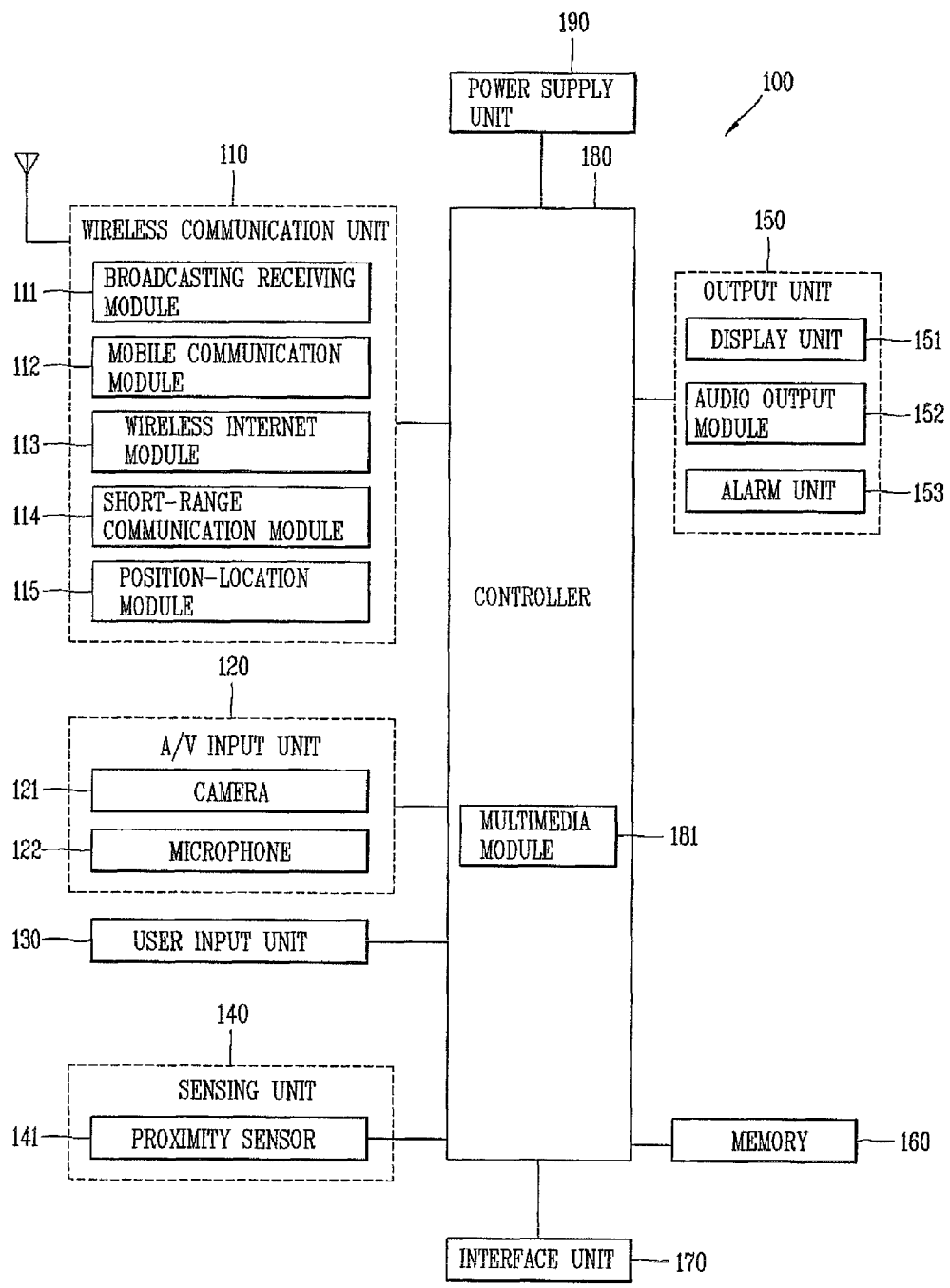
FIG. 1 is a diagram showing an internal configuration of one embodiment of a portable terminal.

FIG. 1 shows one embodiment of a portable terminal 100, which includes a wireless communication unit 110, an Audio/Video (A/V) input unit 120, a user input unit 130, a sensing unit 140, an output unit 150, a memory 160, an interface unit 170, a controller 180, and a power supply unit 190. It is to be understood that these components are merely illustrative and that in other embodiments greater, fewer, or other components may be included.

The wireless communication unit 110 may include one or more modules which permit wireless communications between the portable terminal and a wireless communication system, and/or between the portable terminal and a network within which the portable terminal is included. For example, the wireless communication unit may include a broadcast receiving module 111, a mobile communication module 112, a wireless internet module 113, a short-range communication module 114, and a position location module 115.

The broadcast receiving module 111 receives a broadcast signal and/or broadcast associated information from an external broadcast managing entity via a broadcast channel.

The broadcast channel may be a satellite channel and/or a terrestrial channel. The broadcast managing entity may indicate a server which generates and transmits a broadcast signal and/or broadcast associated information, or a server which receives a pre-generated broadcast signal and/or broadcast associated information and sends them to the portable terminal. The broadcast signal may be implemented as a TV broadcast signal, a radio broadcast signal, or a data broadcast signal, among others. The broadcast signal may further include a data broadcast signal combined with a TV or radio broadcast signal.

Examples of broadcast associated information include information associated with a broadcast channel, a broadcast program, a broadcast service provider, and the like. The broadcast associated information may be provided via a mobile communication network, and received by mobile communication module 112.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), or the like.

The broadcast receiving module 111 may be configured to receive digital broadcast signals transmitted from various types of broadcast systems. These broadcast systems may include Digital Multimedia Broadcasting-Terrestrial (DMB-T), Digital Multimedia Broadcasting-Satellite (DMB-S), Media Forward Link Only (MediaFLO), Digital Video Broadcast-Handheld (DVB-H), Integrated Services Digital Broadcast-Terrestrial (ISDB-T) or the like. The broadcast receiving module may be configured to be suitable for every broadcast system transmitting broadcast signals as well as the digital broadcasting systems.

Broadcast signals and/or broadcast associated information received via the broadcast receiving module may be stored in a suitable device, such as a memory 160.

Referring to FIG. 1, the A/V input unit 120 may be configured to provide audio or video signal input to the portable terminal. The A/V input unit may include a camera 121 and a microphone 122. The camera receives and processes image frames of still pictures or video obtained by image sensors in a video call mode or a capturing mode. The processed image frames may be displayed on a display unit 151.

The image frames processed by camera 121 may be stored in memory 160 or transmitted to the exterior via wireless communication unit 110. Two or more cameras may be provided according to the configuration of the portable terminal.

The microphone 122 may receive an external audio signal while the portable terminal is in a particular mode such as a phone call mode, a recording mode, a voice recognition mode, or the like. This audio signal is processed into digital data and then converted for output into a format transmittable to a mobile communication base station via the mobile communication module 112 in case of the phone call mode. The microphone may include assorted noise removing algorithms to remove noise generated in the course of receiving the external audio signal.

The user input unit 130 may generate input data inputted by a user to control the operation of the portable terminal. The user input unit may include any one or more of a keypad, a dome switch, a touchpad (e.g., static pressure/capacitance), a jog wheel, and a jog switch or the like.

The sensing unit 140 provides status measurements of various aspects of the portable terminal. For instance, the sensing unit may detect an open/close status of the portable terminal, a change in a location of the portable terminal, a presence or absence of user contact with the portable terminal, the location of the portable terminal, acceleration/deceleration of the portable terminal, and the like, so as to generate a sensing signal for controlling the operation of the portable terminal.

For example, regarding a slide-type portable terminal, sensing unit 140 may sense whether a sliding portion of the portable terminal is open or closed. Other examples include sensing functions such as the sensing unit sensing presence or absence of power provided by power supply unit 190, presence or absence of a coupling or other connection between interface unit 170 and an external device. Also, the sensing unit may include a proximity sensor 141.

The output unit 150 is configured to output an audio signal, a video signal, and/or a tactile signal. According to one embodiment, the output unit includes a display unit 151, an audio output module 152, an alarm 153, and a haptic module 154 as well as other components.

The display unit 151 may output information processed in the portable terminal. For example, when the portable terminal is operating in a phone call mode, the display unit will provide a User Interface (UI) or a Graphic User Interface (GUI) which includes information associated with the call. As another example, if the portable terminal is in video call mode or capturing mode, the display unit may additionally or alternatively display images captured and/or received, UI, or GUI.

The display unit may be implemented using, for example, at least one of a Liquid Crystal Display (LCD), a Thin Film Transistor-Liquid Crystal Display (TFT-LCD), an Organic Light-Emitting Diode (OLED), a flexible display, a three-dimensional (3D) display, or the like.

Some types of these displays may be implemented as a transparent type or an optical transparent type through which the exterior is visible, which is referred to as 'transparent display'. A representative example of the transparent display may include a Transparent OLED (TOLED), and the like. The rear surface of the display unit may also be implemented to be optically transparent. Under this configuration, a user can view an object positioned at a rear side of a terminal body through a region occupied by the display unit of the terminal body.

According to one embodiment, two or more display units may be implemented in the portable terminal. For instance, a plurality of the display units may be arranged on one surface to be spaced apart from or integrated with each other, or may be arranged on different surfaces.

The display unit and a touch sensitive sensor are combined to have a layered structure, the resulting combination may be referred to as a touch screen. The display unit may be used as an input device rather than or as well as an output device, and the touch sensor may be implemented, for example, as a touch film, touch sheet, and/or touch pad.

The touch sensor may be configured to convert changes in pressure or capacitance at a specific location of the display unit into electric input signals. That is, the touch sensor may be configured to sense not only a touched position or a touched area, but also a touch pressure.

When touch inputs are sensed by the touch sensors, corresponding signals are transmitted to a touch controller (not shown). The controller processes the signals and then transmits corresponding data to controller 180, which then senses which region of the display unit has been touched.

Still referring to FIG. 1, a proximity sensor 141 may be arranged at an inner region of the portable terminal covered by the touch screen, or near the touch screen. The proximity sensor may operate to sense the presence or absence of an object approaching a surface to be sensed, or an object near a surface to be sensed, using, for example, electromagnetic field information or infrared rays without mechanical contact. The proximity sensor may be considered to have a longer lifespan and more enhanced utility than a contact sensor.

The proximity sensor may be or include a transmissive-type photoelectric sensor, a direct reflective-type photoelectric sensor, a mirror reflective-type photoelectric sensor, a high-frequency oscillation proximity sensor, a capacitance-type proximity sensor, a magnetic-type proximity sensor, an infrared rays proximity sensor, and/or other types of sensors. When a capacitance-type touch screen is used, the proximity of a pointer to the touch screen is sensed based on changes in electromagnetic field. In this case, the touch screen (touch sensor) may considered a proximity sensor.

In accordance with at least one embodiment, a proximity touch will be understood to correspond to the case where a pointer is positioned to be proximate to the touch screen without contact. A contact touch will be understood to correspond to the case where a pointer substantially comes into contact with the touch screen. For a proximity touch, the position of the touch may correspond considered to be the position where the pointer faces at least substantially perpendicular to the touch screen.

The proximity sensor 141 senses proximity touch and proximity touch patterns (e.g., distance, direction, speed, time, position, moving status, etc.). Information relating to the sensed proximity touch and the sensed proximity touch patterns may be output onto the touch screen.

The audio output module 152 may output audio data received from wireless communication unit 110 or stored in memory 160, in a call-receiving mode, call-placing mode, recording mode, voice recognition mode, broadcast reception mode, and so on. The audio output module may output audio signals relating to functions performed in the portable terminal, e.g., sound alarming a call received or a message received, and so on. The audio output module may include a receiver, a speaker, a buzzer, and so on.

The alarm 153 outputs signals notifying occurrence of events from the portable terminal. The events occurring from the portable terminal may include call received, message received, key signal input, touch input, and so on. The alarm may output not only video or audio signals, but also other types of signals such as signals notifying occurrence of events in a vibration manner. Since the video or audio signals can be output through display unit 151 or audio output unit 152, the display unit and audio output module may be categorized into a part of alarm 153.

The haptic module 154 generates various tactile effects which a user can feel. A representative example of the tactile effects includes vibration. Vibration generated by the haptic module may have a controllable intensity, controllable pattern, and so on. For instance, different vibration may be output in a synthesized manner or a sequential manner.

In addition to or in lieu of vibration, the haptic module may generate an arrangement of pins vertically moving with respect to a person's skin being touched (contacted), air injection force or air suction force through an injection hole or a suction hole, touch by a skin surface, presence or absence of contact with an electrode, effects by stimulus such as an electrostatic force, reproduction of cold or hot feeling using a heat absorbing device or a heat emitting device, and/or the like.

The haptic module may be configured to transmit tactile effects (signals) through a user's direct contact or muscular sense using a finger or hand. According to one embodiment, two or more haptic module may be included in the portable terminal.

The memory 160 may store a program for the processing and control of controller 180. Alternatively, the memory may temporarily store input/output data (e.g., phonebook data, messages, still images, video and the like). Also, the memory may store data related to various patterns of vibrations and audio output upon the touch input on the touch screen.

The memory may be implemented using any type of suitable storage medium including a flash memory type, a hard disk type, a multimedia card micro type, a memory card type (e.g., SD or DX memory), Random Access Memory (RAM), Static Random Access Memory (SRAM), Read-Only Memory (ROM), Electrically Erasable Programmable Read-only Memory (EEPROM), Programmable Read-only Memory (PROM), magnetic memory, magnetic disk, optical disk, and/or the like. Also, the portable terminal may operate a web storage which performs the storage function of the memory on the Internet.

The interface unit 170 may generally be implemented to interface the portable terminal with external devices. For example, the interface unit may allow data reception from an external device, a power delivery to each component in the portable terminal 100, and/or a data transmission from the portable terminal to an external device. The interface unit may include, for example, wired/wireless headset ports, external charger ports, wired/wireless data ports, memory card ports, ports for coupling devices having an identification module, audio Input/Output (I/O) ports, video I/O ports, earphone ports, and/or the like.

The identification module may be configured as a chip for storing various information required to authenticate an authority to use the portable terminal, which may include a User Identity Module (UIM), a Subscriber Identity Module (SIM), and the like. Also, the device having the identification module (hereinafter, referred to as 'identification device') may be implemented in a type of smart card. Hence, the identification device can be coupled to the portable terminal via a port.

Also, interface unit 170 may serve as a path for power to be supplied from an external cradle to the portable terminal when the portable terminal is connected to the external cradle, or as a path for transferring various command signals inputted from the cradle by a user to the portable terminal. Such various command signals or power inputted from the cradle may operate as signals for recognizing that the portable terminal has accurately been mounted to the cradle.

The controller 180 typically controls overall operations of the portable terminal. This includes, for example, control and processing operations associated with telephony calls, data communications, video calls, and the like. The controller may include a multimedia module 181 which provides multimedia playback. The multimedia module may be configured as part of the controller or as a separate component. In addition to the aforementioned operations, the controller may perform a pattern recognition processing to recognize writing or drawing input on the touch screen as text or image.

The power supply unit 190 may provide power to various components under control of controller 180. The power may be internal power, external power, or a combination thereof.

Various embodiments described herein may be implemented in a computer-readable medium using software, hardware, or a combination thereof.

For a hardware implementation, the embodiments described herein may be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, micro processors, and/or other electronic units designed to perform the functions described herein, or a selective combination thereof. In some cases, such embodiments are implemented by controller 180.

For a software implementation, procedures and functions of the terminal may be implemented together with separate software modules, each of which performs at least one of the functions and/or operations. Software code can be implemented with a software application written in any suitable programming language. Also, the software code may be stored, for example, in memory 160 and executed by controller 180.

Figure 2:
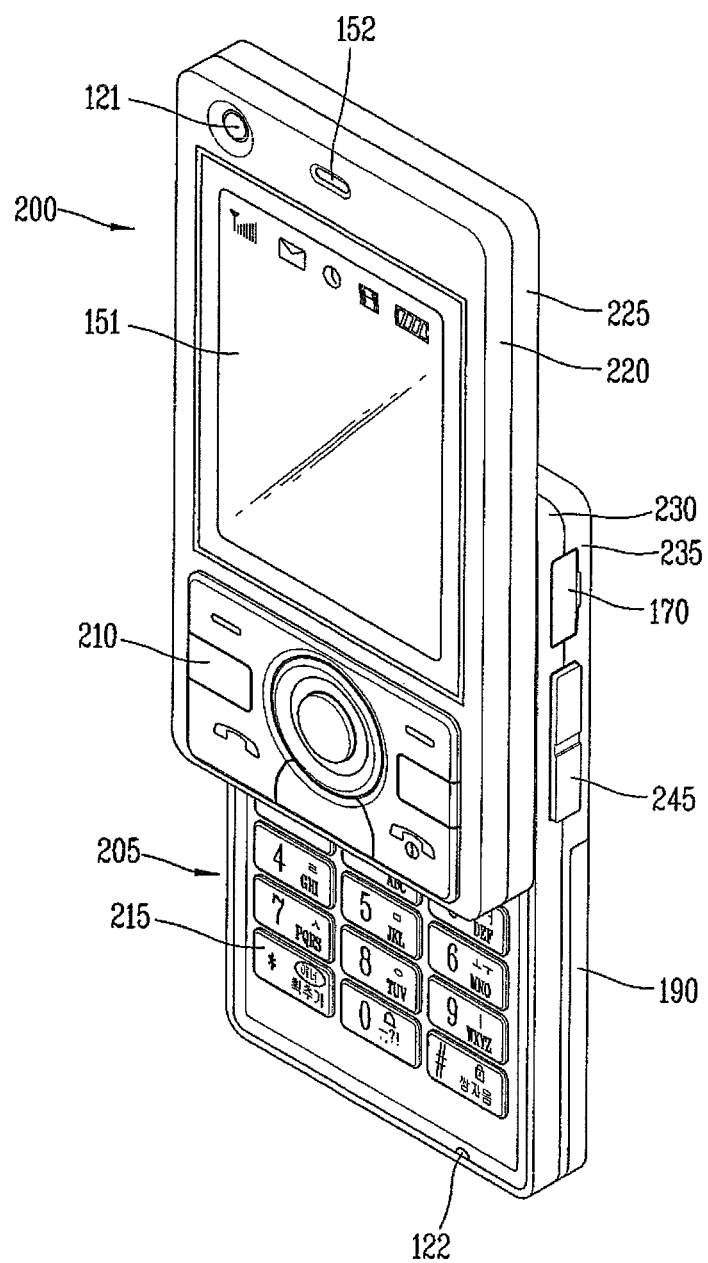
FIG. 2 is a diagram showing a front view of a portable terminal in accordance with the aforementioned or another embodiment.

FIG. 2 shows a front view of one embodiment of the portable terminal, which in this example is a slide-type portable terminal having two bodies coupled to and movable relative to each other. In other embodiments, the portable terminal may be a bar-type, folder-type, swing-type, swivel-type or other type of terminal.

In the embodiment of FIG. 2, the terminal includes a first body 200 and a second body 205 which slides relative to the first body in at least one direction. When the first body is positioned over the second body, the terminal is considered to be in a closed position (closed state or closed configuration). When the first body slides to expose at least part of the second body, the terminal is considered to be in an open position (open state or open configuration).

When implemented as a folder-type terminal, the terminal may include a first body and a second body having one or more sides folded to or unfolded from the first body. When the second body is folded to the first body, the terminal may be considered to be in a closed state. And, when the second body is unfolded from the first body, the terminal may be considered to be in an open state.

When implemented as a swing-type terminal, the terminal may include a first body and a second body configured to swing relative to the first body. When the first body is arranged to overlap the second body, the terminal may be considered to be in a closed state. And, when the first body swings to expose the second body, the terminal may be considered to be in an open state. Detailed explanations for the folder type terminal and the swing type terminal will be omitted since they have been already well-known to those skilled in the art.

In accordance with the foregoing implementations, the portable terminal may typically operate in standby mode in the closed state. The standby mode may be released according to a user's manipulation. The terminal may typically operate in a call-communication mode in the open state, but this mode may be converted into the standby mode according to the user's manipulation or after a certain time duration.

A case (casing, housing, cover, etc.) forming an outer appearance of first body 200 may be formed from a first front case 220 and a first rear case 225. A space formed by the first front case and first rear case may accommodate various components therein. At least one intermediate case may further be disposed between the first front and first rear cases. These cases may be formed, for example, by injection-molded synthetic resin or using a metallic material such as stainless steel (STS) or titanium (Ti).

The first front case 220 may include display unit 151, first audio output module 152, first camera 121, and user input unit 210 as well as other features. Audio output module 152 may be implemented in the form of a speaker, and camera 121 may be configured to capture a user's still image or moving image.

The case of second body 205 may be formed by a second front case 230 and a second rear case 235. A second manipulation unit 215 may be disposed at the second body, for example, at a front surface of the second front case. At least one of second front case 230 or second rear case 235 may be provided with a third manipulation unit 245, a microphone 122, and an interface unit 170. The first to third manipulation units 210, 215 and 245 may be collectively referred to as a user input unit 130. One or more of these units may be employed in a tactile manner, i.e., a user can touch or tap to achieve manipulation.

For instance, manipulation may be implemented as a dome switch, a touch screen, a touchpad or the like by which a user can input commands or information in a pushing or touching manner. Alternatively, manipulation may be implemented by a wheel or a jog which rotates keys or a joystick.

From the functional perspective, first user input unit 210 may be configured to input commands such as START, END, SCROLL or the like, and second user input unit 215 may be configured to input numbers, letters (characters), symbols or the like. The first user input unit may include soft keys communicated with icons on display unit 151 and navigation keys (four directional keys and one central key) for directional indication and certification.

Third user input unit 245 may serve as a hot key which performs a specific function, such as activating a component inside the portable terminal.

The microphone 122 may be implemented in a form suitable for receiving a user's voice, another sound, etc.

The interface unit 170 may serve as a passage through which the portable terminal exchanges data with an external device.

The power supply unit 190 for supplying power to the portable terminal is mounted to second rear case 235.

The power supply unit 190 may be implemented as a rechargeable battery to be detachably mounted to the second rear case.

Figure 3:
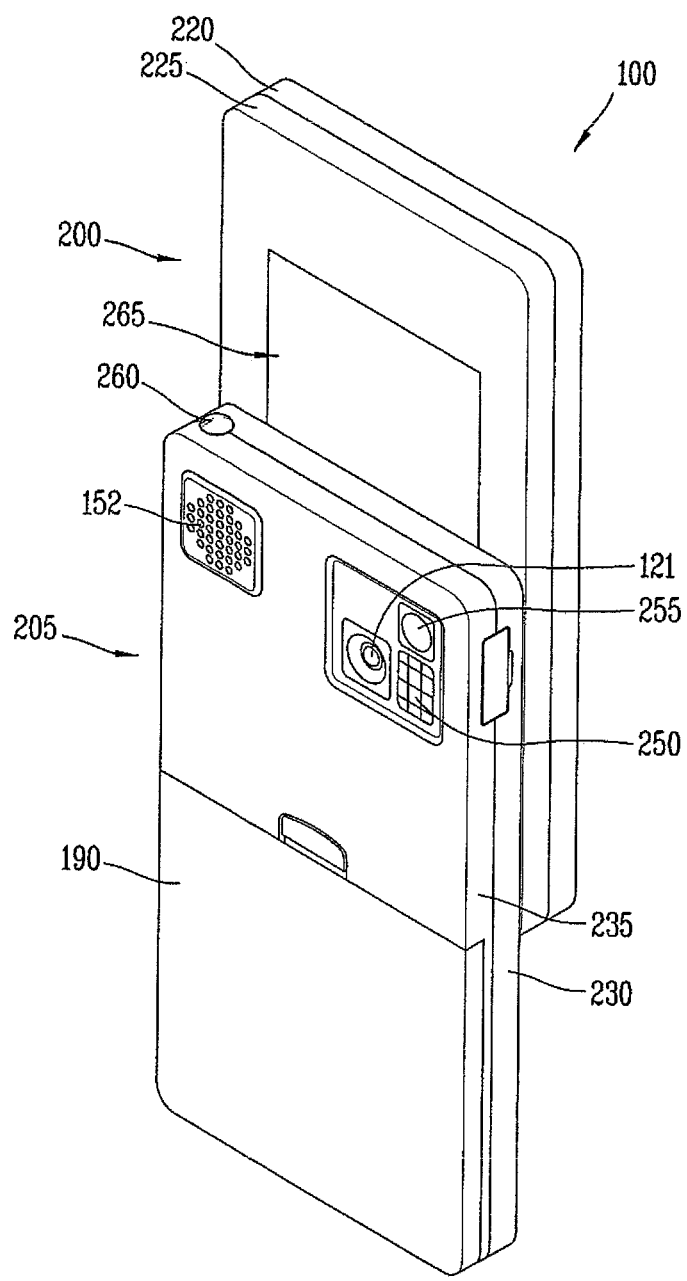
FIG. 3 is a diagram showing a rear view of the terminal in FIG. 2.

FIG. 3 shows a rear view of the portable terminal in FIG. 2. As shown, a rear surface of the second rear case 235 of second body 205 may be provided with a camera 121. The camera of the second body faces a direction opposite to a direction faced by the camera 121 of first body 200 and may have a different pixel resolution from the camera of the first body.

For example, the camera of the first body may operate with a relatively lower number of pixels (lower resolution). Thus, the first camera may be useful when a user wants to capture his face and send it to another party during a video call or the like. On the other hand, the camera of the second body 205 may operate with a relatively higher number pixels (higher resolution), which may prove useful for a user to obtain higher quality pictures for later use.

A flash 250 and mirror 255 may be disposed adjacent the camera of the second body. The flash may operate in conjunction with the camera of the second body when taking a picture, and the mirror may useful in allowing a user to photograph himself in a self-portrait mode.

An audio output module 152 may be disposed at the second rear case. The audio output module of the second body may cooperate with the audio output module of the first body to provide stereo output. Also, either or both audio output modules may be configured to operate as a speakerphone.

A broadcast signal receiving antenna 260 may be disposed at one side of second rear case 235 (in addition to another communications antenna) and may be retractable into the second body.

A part of a slide module 265 for slidably coupling the first body to the second body may be disposed at first rear case 225 of the first body. Another part of the slide module may be disposed at second front case 230 of the second body, so as not to be exposed to the exterior as shown in drawing.

Second camera 121 or the like may be disposed at second body 205; however, other locations are possible. It is also possible that one or more of the components implemented on second rear case 235 (such as the camera 121 of the second body) may be alternatively implemented on first body 200, e.g., on first rear case 225. The component(s) disposed on the first rear case may be protected by second body 205 in a closed state of the portable terminal. In addition, the camera of the first body can be implemented to be rotatable, e.g., to rotate to a direction which the camera of the second body faces. The rotation may occur independently from the camera of the second body.

The portable terminal of FIGS. 1-3 may be configured to operate within a communication system which transmits data via frames or packets, including both wireless and wire line communication systems an/or satellite-based communication systems. Such systems utilize different air interfaces and/or physical layers.

Examples of such air interfaces or communication protocols include frequency division multiple access (FDMA), time division multiple access (TDMA), code division multiple access (CDMA), and universal mobile telecommunications system (UMTS), the long term evolution (LTE) of the UMTS, and the global system for mobile communications (GSM). By way of a non-limiting example only, further description will relate to a CDMA communication system, but such teachings apply equally to other system types.

Figure 4:
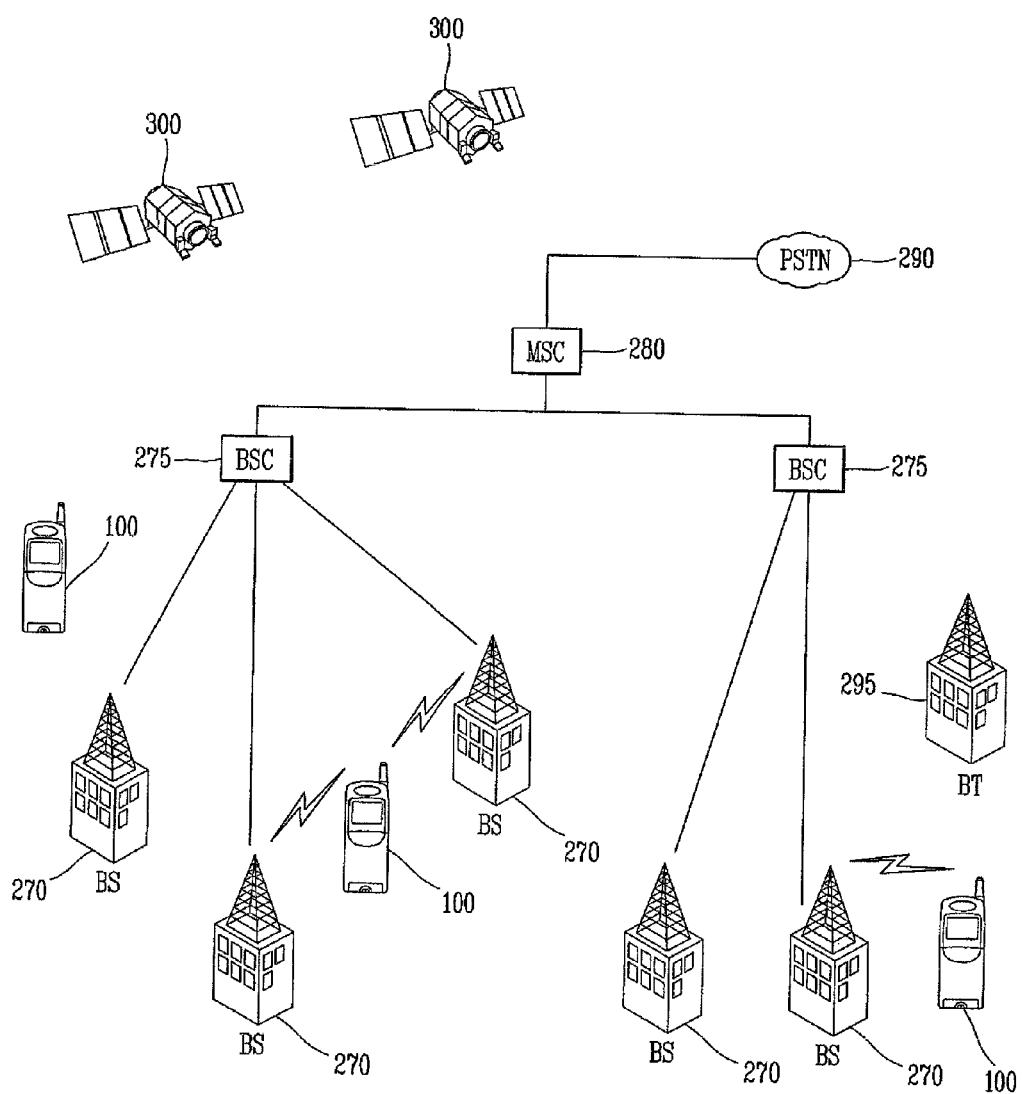
FIG. 4 is a diagram showing an example of a communication system that may be operable with a portable terminal in accordance with one or more embodiments.

FIG. 4 shows an example of a CDMA wireless communication system having a plurality of portable terminals 100, a plurality of base stations 270, a plurality of base station controllers (BSCs) 275, and a mobile switching center (MSC) 280.

The MSC 280 may be configured to interface with a public switch telephone network (PSTN) 290 and to interface with the BSCs 275. Further, the BSCs may be coupled to base stations 270 via backhaul lines. In addition, the backhaul lines may be configured in accordance with any one of several interfaces including, for example, E1/T1, ATM, IP, PPP, Frame Relay, HDSL, ADSL, or xDSL. Further, the system may include more than two BSCs 275.

Also, each base station 270 may include one or more sectors, each sector having an omnidirectional antenna or an antenna pointed in a particular direction radially away from the base station. Alternatively, each sector may include two antennas for diversity reception. In addition, each base station may be configured to support a plurality of frequency assignments, with each frequency assignment having a particular spectrum (e.g., 1.25 MHz, 5 MHz).

The intersection of a sector and frequency assignment may be referred to as a CDMA channel. The base stations may also be referred to as base station transceiver subsystems (BTSs). In some instances, the term "base station" may be used to refer collectively to a BSC 275, and one or more base stations 270.

The base stations 270 may also be denoted as "cell sites." Alternatively, individual sectors of a given base station 270 may be referred to as cell sites. Further, a terrestrial digital multimedia broadcasting (DMB) transmitter 295 is shown broadcasting to portable terminals 100 operating within the system.

In addition, the broadcast receiving module 111 (FIG. 1) of the portable terminal is typically configured to receive broadcast signals transmitted by the DMB transmitter. Similar arrangements may be implemented for other types of broadcast and multicast signaling as discussed above.

FIG. 4 also shows several global positioning system (GPS) satellites 300. Such satellites facilitate locating the position of some or all of the portable terminals. In FIG. 4, two satellites are shown, but positioning information may be obtained with greater or fewer numbers of satellites. In addition, the position-location module 115 (FIG. 1) of the portable terminal is typically configured to cooperate with the satellites to obtain desired position information. However, other types of position detection technology, such as location technology that may be used in addition to or instead of GPS location technology, may alternatively be implemented. Some or all of the GPS satellites may alternatively or additionally be configured to provide satellite DMB transmissions.

Further, during typical operation of the wireless communication system, base stations 270 receive sets of reverse-link signals from various portable terminals. The portable terminals engage in calls, messaging, and other communications. In addition, each reverse-link signal received by a given base station 270 is processed within that base station, and the resulting data is forwarded to an associated BSC 275. The BSC provides call resource allocation and mobility management functionality including soft handoffs between the base stations.

Further, the BSCs also route the received data to MSC 280, which provides additional routing services for interfacing with PSTN 290. Similarly, the PSTN interfaces with the MSC and the MSC interfaces with BSCs 275. The BSCs also control base stations 270 to transmit sets of forward-link signals to the portable terminals.

Figure 5:
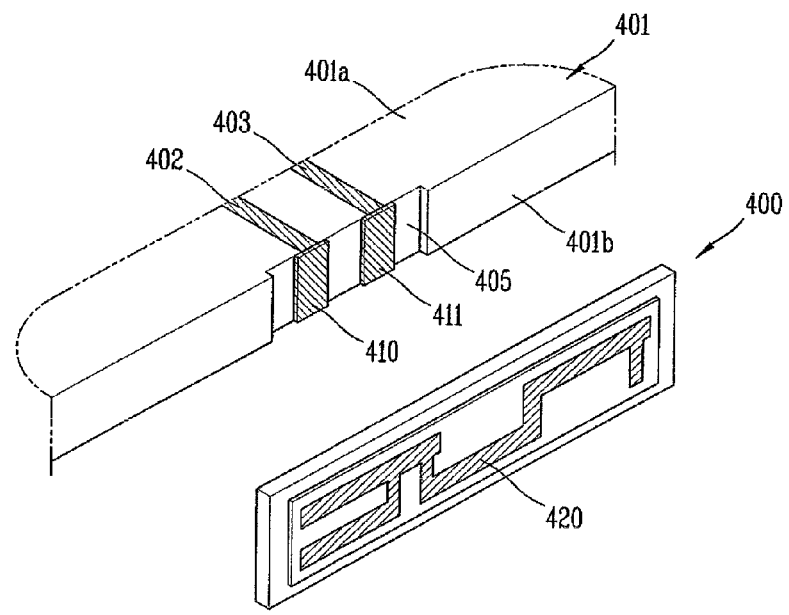
FIG. 5 is a diagram showing one embodiment of a portable terminal antenna.

FIG. 5 shows a disassembled view of an antenna 400 for a portable terminal and a circuit board 401 for mounting the antenna according to one embodiment. The antenna is formed in a plate shape along one direction and is formed to be thin so as to be easily inserted into a narrow gap. However, the external appearance of antenna 400 may be varied according to an inner space of the portable terminal.

The circuit board to which the antenna is coupled includes a component mounting surface 401a and an edge surface 401b adjacent to the component mounting surface. In case of a hard circuit board, a thickness may be formed to be 1 mm or less. Accordingly, the edge surface may be formed to have a small width.

The edge surface of the circuit board may provided with contact pads 410 and 411 contacting feeding portions (refer to 431 and 432 of FIG. 6) of the antenna. The contact pads may be patterned on the edge surface in the form of Cu foil, Al foil or Au foil. Also, the contact pads may be implemented in the form of stacked layers so as to obtain a sufficient thickness.

The contact pads are respectively coupled to conductive horizontal extension portions 402 and 403 formed on component mounting surface 401a. The horizontal extension portions are shown as being formed on the surface of the circuit board 401. However, in the case where circuit board 401 is implemented in the form of stacked layers, horizontal extension portions 402 and 403 may be formed at intermediate layers so as not to be viewable from the outside. The horizontal extension portions 402 and 403 are coupled to a wireless communication module (not shown) for processing a signal received at antenna 400 or a signal to be transmitted to the antenna.

A region of edge surface 401b where contact pads 410 and 411 are formed in this example may be concaved shaped more than other regions. Accordingly, a predetermined space may be provided for accommodating therein feeding portions 431 and 432 of the antenna.

Rather than the Cu foil or Au foil, contact pads 410 and 411 may be implemented as a conductive metal plate fixed onto circuit board 401. The metal plate may be fixed onto the circuit board in an attaching or molding manner, rather than in an electroplating manner.

A radiator 420 formed of conductive metal is provided at the antenna 400. The radiator 420 may be formed to have a length that is long enough to cover a preset frequency bandwidth. Physically, the radiator may be implemented as a flexible printed circuit board (FPCB) that can be easily fabricated, or may be implemented as a chip antenna or other form of antenna. In the case that the radiator is implemented as a flexible PCB, the antenna may have a more reduced thickness to allow the portable terminal to become smaller and thinner.

Figure 6:
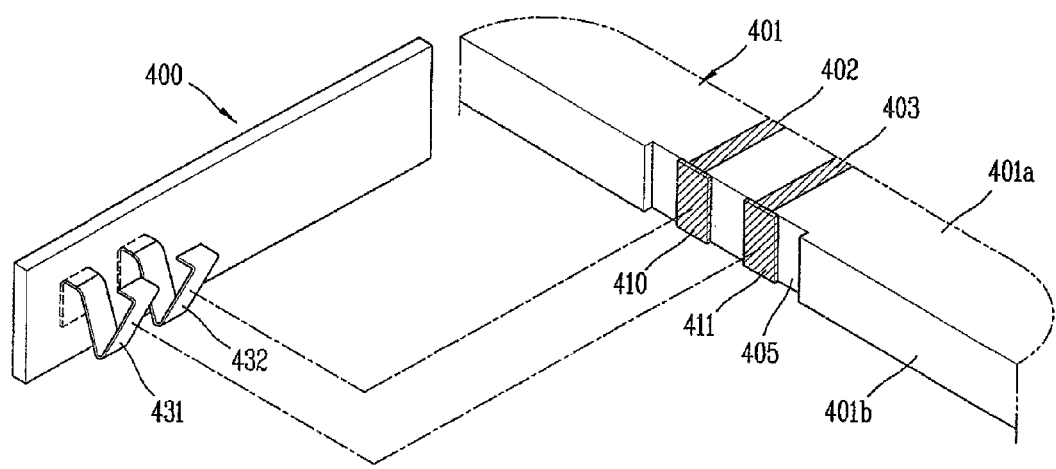
FIG. 6 is a diagram showing another view of the antenna in FIG. 5.

FIG. 6 is a disassembled view of the antenna and circuit board of FIG. 5 from a different perspective. As shown, feeding portions 431 and 432 are respectively coupled with contact pads 410 and 411 formed on a rear surface of the antenna. The function and number of feeding portions may be varied according to the type of antenna 400 used. For instance, when the antenna is designed to operate for multiple bandwidths, a feeding portion for a high bandwidth and a feeding portion for a low bandwidth may be formed. And, a ground feeding portion for connection with the ground may be formed.

According to one embodiment, the feeding portions 431 and 432 may be implemented in the form of conductive metal springs. The feeding portions, which may increase the entire thickness of the antenna, may be configured to contact edge surface 401b, not the component mounting surface 401a. This may reduce the entire thickness of the portable terminal, and provide a space for mounting other components.

Figure 7:
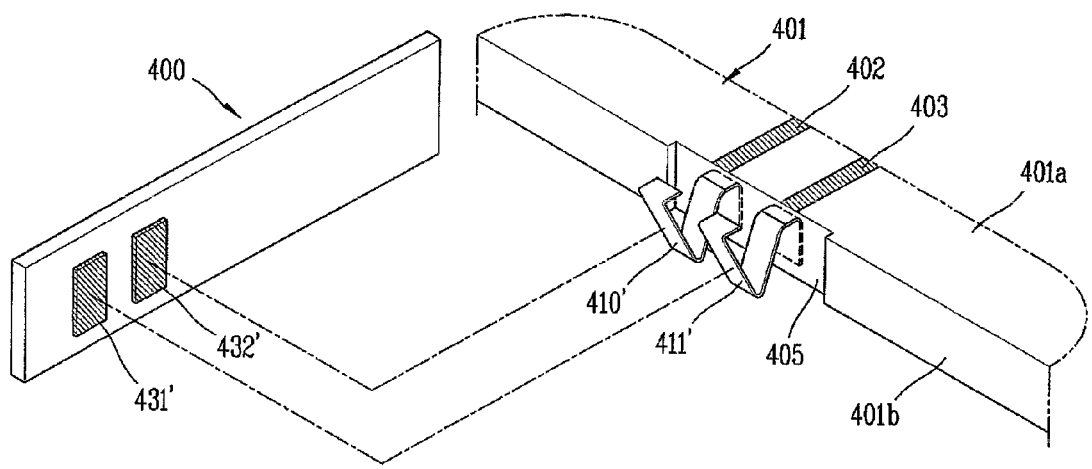
FIG. 7 is a diagram showing an antenna feed structure which may be used, for example, with the aforementioned antenna.

FIG. 7 shows a disassembled view of another embodiment of an antenna feed structure that may be used on a portable terminal. In this embodiment, the locations contact pads 410' and 411' and feeding portions 431' and 432' are switched compared to FIG. 6. That is, contact pads 410' and 411' are implemented as conductive elastic springs and feeding portions 431' and 432' are implemented as flat pads. The contact pads may be fixed onto edge surface 401b of circuit board 401, for example, by soldering.

Figure 8:
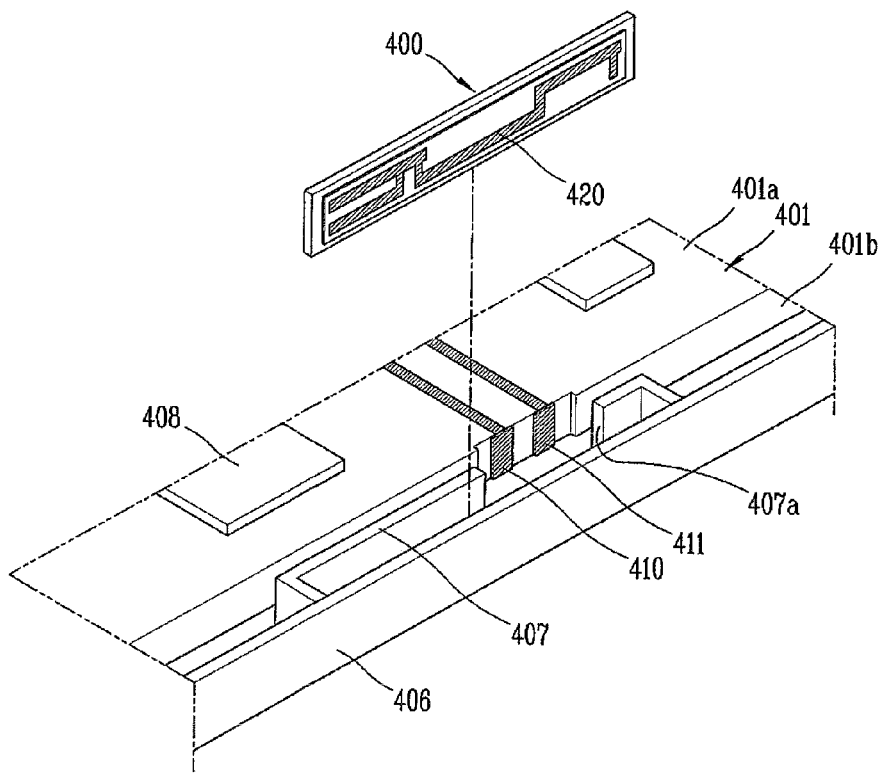
FIG. 8 is a diagram showing one way in which the aforementioned or another type of antenna may be mounted to a portable terminal housing.

FIG. 8 shows is a disassembled view showing one way the antenna may be mounted to a terminal housing 406. In this example, the terminal housing is formed to include circuit board 401 with a narrow gap from the circuit board 401. And, an antenna mounting portion 407 for mounting the antenna shown in FIGS. 5 to 7 is formed on an inner side surface of terminal housing 406.

The antenna mounting portion 407 is implemented in the form of a rib having a hole corresponding to the thickness of the antenna, so that the antenna can be inserted thereinto in a side direction. And, an opening 407a for passing the feeding portions 431 and 432 therethrough is formed at an intermediate part of antenna mounting portion 407. Under these structures, once the antenna is fitted into antenna mounting portion 407, feeding portions 431 and 432 come in contact with contact pads 410 and 411 formed on edge surface 401b of the circuit board. This may allow a distance between the antenna and edge surface to be constantly maintained.

It is possible that antenna mounting portion 407 has another shape rather than the shape shown in FIG. 8. For instance, the antenna may be provided with a hole and terminal housing 406 may be provided with a protrusion or a hook locked by the hole when the antenna is inserted into the terminal housing. Under this structure, the antenna may be fixed to the inside of the terminal housing.

Figure 9:
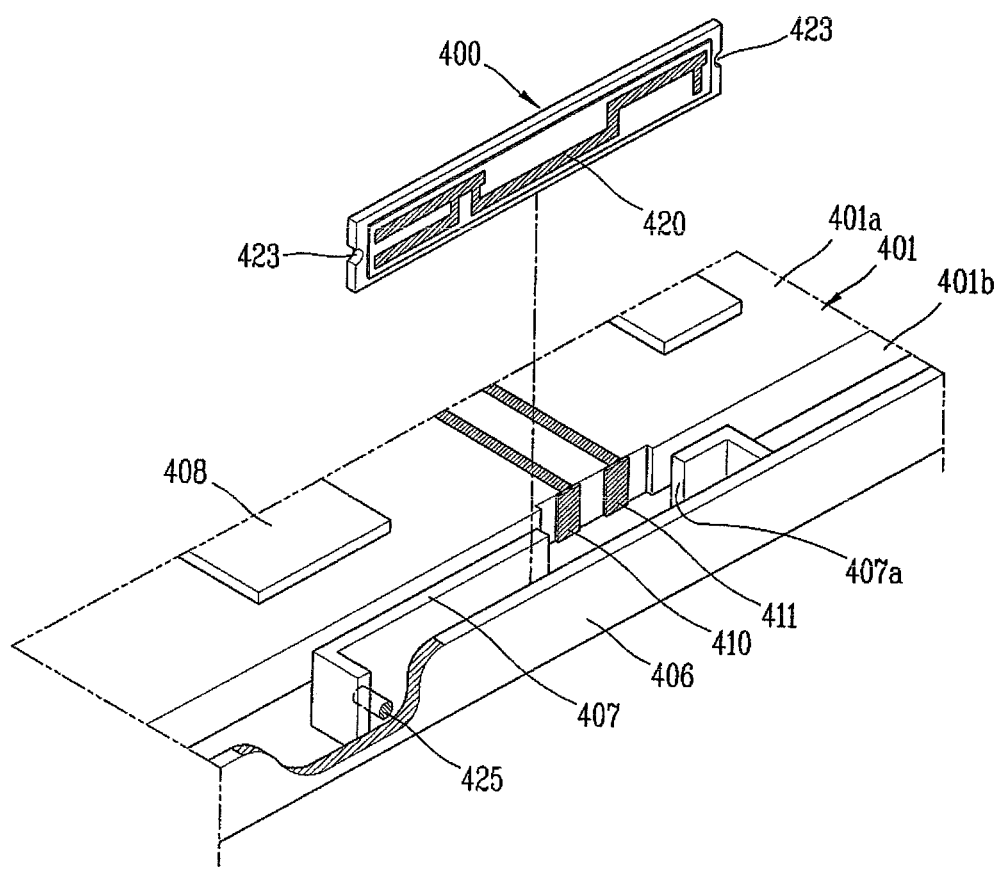
FIG. 9 is a diagram showing another way in which the aforementioned or another type of antenna may be mounted to a portable terminal housing.

FIG. 9 shows a disassembled view of another way the antenna may be mounted to a terminal housing. In this example, the antenna is provided with side holes 423 to prevent the antenna from moving in a thickness direction of circuit board 401. The antenna mounting portion 407 may be provided with hook members or protrusions 425 locked by the side holes 423 when the antenna is in an inserted state into the antenna mounting portion.

Figure 10:
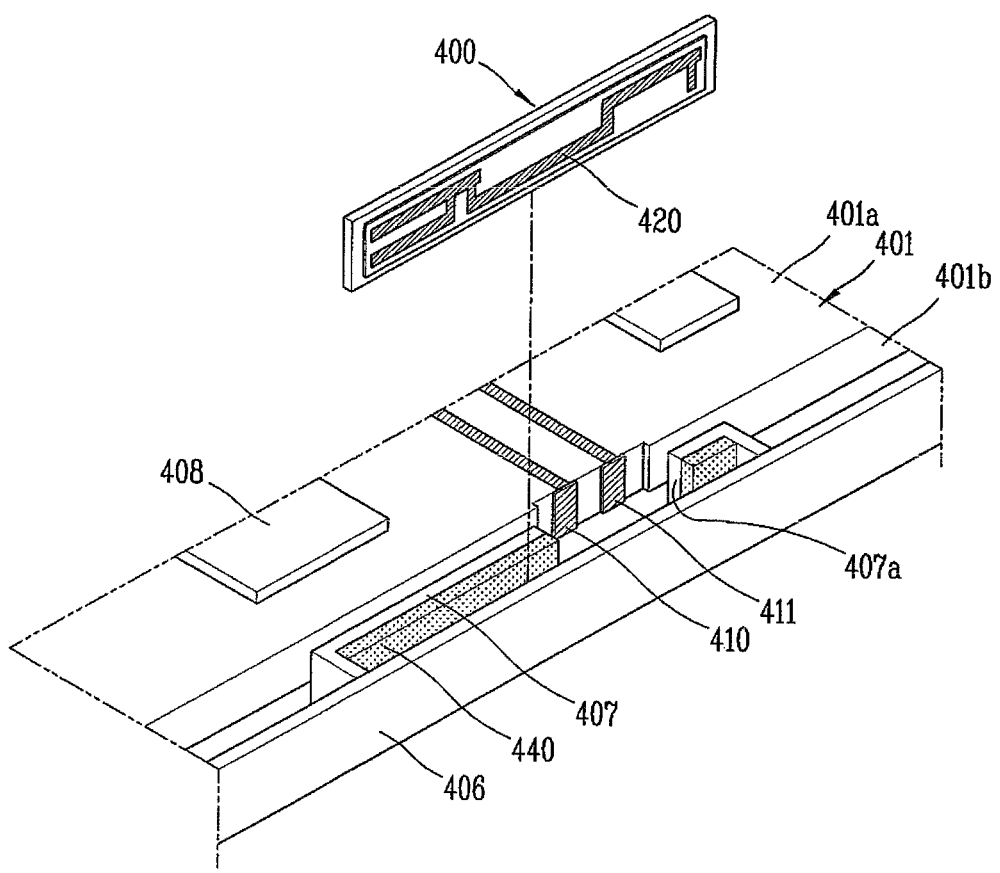
FIG. 10 is a diagram showing another way in which the aforementioned or another type of antenna may be mounted to a portable terminal housing.

FIG. 10 shows a disassembled view of another way the antenna may be mounted to a terminal housing. In this example, in order to minimize changes in distance between the antenna and edge surface 401b due to a pressed state of terminal housing 406, a spacer 440 may be formed between antenna mounting portion 407 or antenna 400 and the circuit board. The spacer may be formed, for example, of compressible material to prevent movement of the antenna and/or noise from occurring between the circuit board and antenna.

Figure 11:
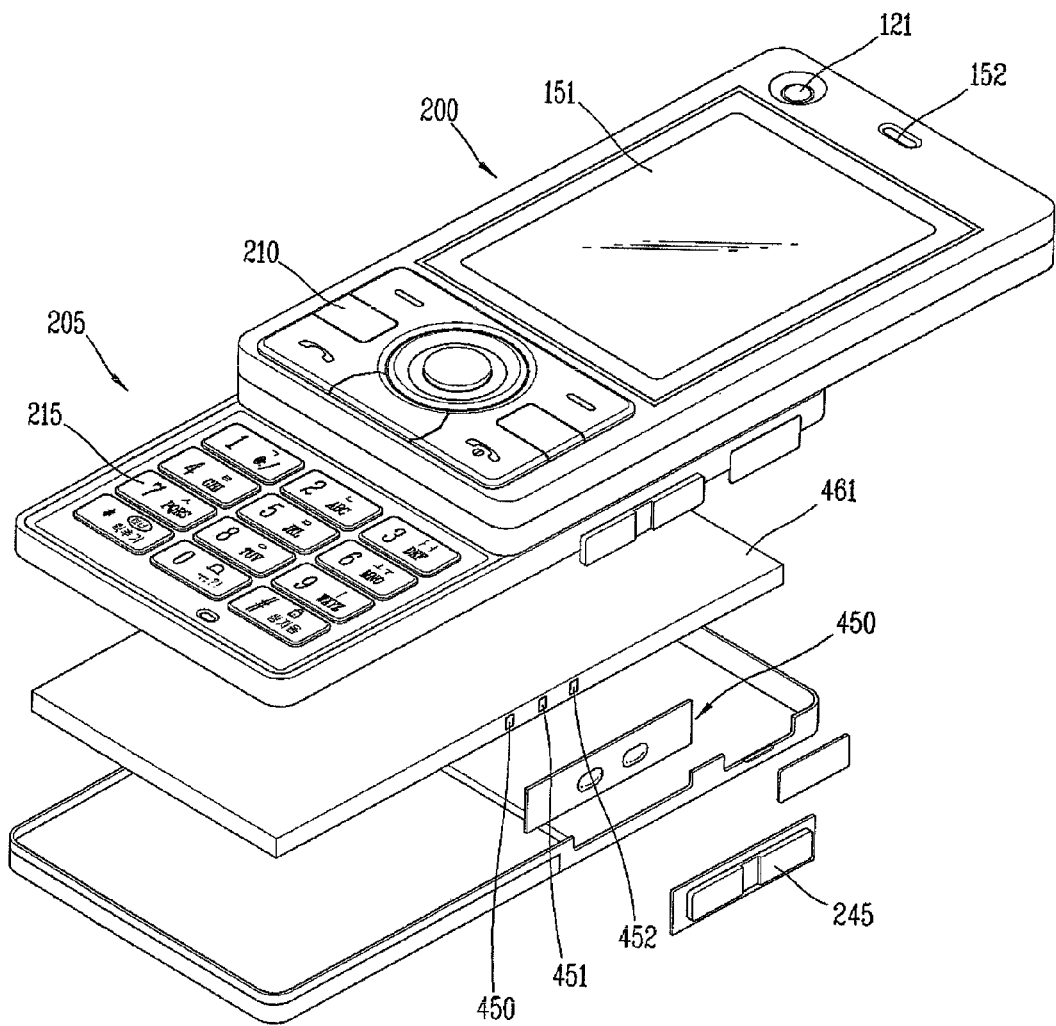
FIG. 11 is a diagram showing a disassembled view of one embodiment of a portable terminal.
Figure 12:
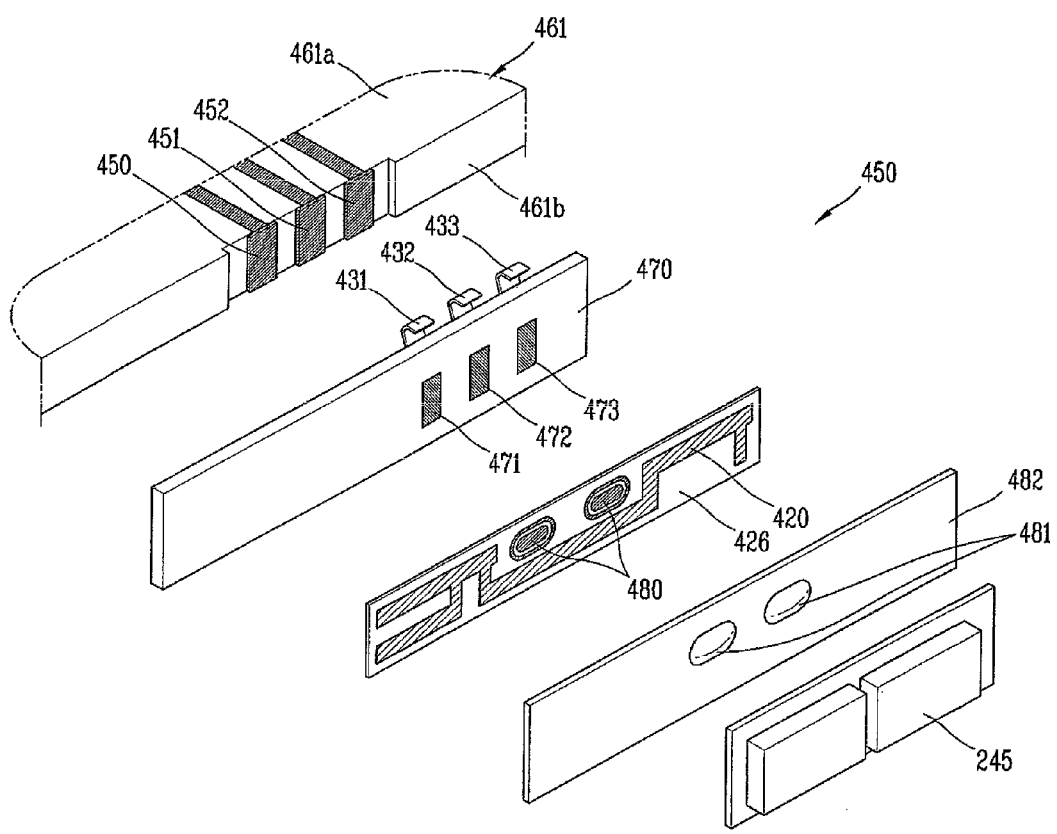
FIG. 12 is a diagram showing a disassembled view of an antenna to be used in the portable terminal shown in FIG. 11.

FIG. 11 shows a partially disassembled view of another embodiment of a portable terminal, and FIG. 12 is a disassembled perspective view of an antenna 450 in FIG. 11. One or more dome switches 481 may additionally be included and operated when respective side keys 245 are pressed. In this embodiment, the antenna may serve as a substrate having the side keys mounted thereon.

The antenna 450 includes a dielectric supporting plate 470 formed of dielectric material, a flexible printed circuit board (FPCB) 426 formed on the dielectric supporting plate 470, and a dome sheet 482.

The dielectric supporting plate 470 serves to support the FPCB and dome sheet, and may serve to minimize deformation or movement of the FPCB that may occur when dome switches on the dome sheet are pressed. In this embodiment, the dielectric supporting plate includes terminals 431, 432 and 433 which contact respective contact pads 450, 451 and 452 formed on edge surface 461b of circuit board 461. Terminals 431, 432 and 433 are fixed on the dielectric supporting plate and electrically coupled to contact points 480 of the FPCB.

At least one of terminals 431, 432 and 433 may be configured to serve as, not only a feeding portion of the FPCB, but also for connecting contact points 480 to circuit board 461. The configurations of terminals 431, 432 and 433 and contact pads 450, 451 and 452 may reduce the number of components of side keys 245 and FPCB 426.

When a user presses the side button 245, the dome switch 481 is electrically connected to the contact points 480. The electrical signal is transmitted to the contact pads 450, 451 and 452 via connecting pads 471, 472 and 473 on a front surface of the dielectric supporting plate 470, and via the terminals 431, 432 and 433 on a rear surface of the dielectric supporting plate 470. The electric signal transmitted to the contact pads 450, 451 and 452 is transmitted to the circuit board 461. An RF signal received by the radiator 420 is also transmitted to the circuit board 461 via the connecting pads 471, 472 and 473, the terminals 431, 432 and 433 and the contact pads 450, 451 and 452.

In the portable terminal according to the embodiments disclosed herein, the antenna comes into contact with an edge surface, not the component mounting surface, of a circuit board. This may prevent the entire thickness of the portable terminal from being increased because of incorporation of the antenna.

Moreover, the contact structure between the antenna and edge surface of the circuit board may be implemented by forming contact pads on the circuit board. This may together be formed when the circuit board is manufactured, thereby reducing costs.

Furthermore, because the antenna is installed on an edge surface of the circuit board, electromagnetic interference may be reduced and wireless characteristics and quality may be enhanced.

Thus, according to one or more embodiments, an antenna structure is provided for a portable terminal which is capable of minimizing space occupied by an antenna and further is capable of implementing excellent wireless communication quality.

To achieve these and other advantages, a portable terminal is provided which comprises: a terminal housing; a circuit board mounted in the terminal housing, and having a component mounting surface and an edge surface; a contact pad formed on the edge surface; and an antenna having a feeding portion contacting the contact pad, and configured to transmit and receive electric wave.

The antenna may include a dielectric supporting plate disposed on the edge surface in parallel, and a conductive radiator formed at the dielectric supporting plate. The radiator may be a flexible PCB type radiator. The feeding portion may be implemented as an elastic spring. An antenna mounting portion for inserting the antenna thereinto may be formed on an inner side surface of the housing.

The antenna mounting portion may be implemented as a rib having an opening through which the feeding portion passes. The antenna may be provided with a side hole on a side surface thereof, and the antenna mounting portion may be provided with a protrusion locked by the side surface of the antenna.

A spacer for maintaining a constant distance between the antenna and the circuit board may be mounted between the antenna and the circuit board. The spacer may be formed of compressible material so as to prevent movement of the antenna d, or noise occurring between the circuit board and the substrate. The contact pad may be connected to a horizontal extension portion of the component mounting surface.

In accordance with another embodiment, a portable terminal comprises: a circuit board installed inside a terminal housing; and an antenna connected to the circuit board, wherein the antenna comprises: a conductive radiator configured to feed a signal to an edge surface of the circuit board; and a switch of a side key installed on a side surface of the terminal housing.

The antenna may be a flexible PCB type antenna. The antenna may include a feeding portion implemented as an elastic spring, so as to contact a contact pad formed on an edge surface of the circuit board. The antenna may further include contact points contacting the switches.

When used herein, the terms "module" or "unit" or "portion" may be understood to be implemented in terms of hardware, software, or a combination thereof. These terms may also have different meanings as understood by those skilled in the art depending upon the contexts in which they are used.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A portable terminal, comprising:
   a circuit board having an edge surface and a component mounting surface;
   an antenna of plate shape mounted within a housing of the terminal substantially in parallel with the edge surface and substantially in perpendicular to the component mounting surface; and
   an antenna mounting portion in a form of a rib formed at an inner side surface of the housing of the terminal to provide the antenna therein, the antenna mounting portion to provide a space for the antenna to be provided between the inner side surface of the housing and a portion of the rib,
   wherein the component mounting surface is mounted within the housing substantially in parallel with a display screen of the terminal and the edge surface is installed within the housing substantially in perpendicular to the display screen,
   wherein a width of the antenna of plate shape in a first direction is substantially equal to a width of the edge surface in the first direction,
   wherein a first contact terminal formed on the edge surface and a second contact terminal formed on the antenna of plate shape are coupled together to process a signal between the circuit board and the antenna,
   wherein the antenna of plate shape includes at least one groove, wherein the antenna mounting portion includes at least one protrusion, and wherein the groove and the protrusion are coupled to prevent the antenna from moving away from the circuit board in the first direction when the antenna is provided in the space and the protrusion is provided at the groove.

2. The portable terminal of claim 1, wherein the first contact terminal includes a spring contact that deflects when brought into contact with the second contact terminal, and wherein the second contact terminal includes a contact pad.

3. The portable terminal of claim 1, wherein the first contact terminal includes a contact pad and the second contact terminal includes a spring contact that deflects when brought into contact with the first contact terminal.

4. The portable terminal of claim 1, wherein the antenna does not contact the component mounting surface of the circuit board.

5. The portable terminal of claim 1, further comprising:
   at least one conductive trace that is coupled to the first contact terminal and that extends across the component mounting surface of the circuit board.

6. The portable terminal of claim 1, wherein the second contact terminal is located on a first surface of a substrate of the antenna and a conductive radiator pattern is located on an opposing second surface of the antenna.

7. The portable terminal of claim 6, wherein the conductive radiator pattern is formed on a flexible printed circuit board.

8. The portable terminal of claim 1, wherein the antenna mounting portion includes an opening at an intermediate part of the antenna mounting portion to allow the first contact terminal at the circuit board to contact the second contact terminal at the antenna.

9. The portable terminal of claim 1, wherein the rib includes a first portion that extends in the first direction and a second portion that extends in a second direction.

10. A portable terminal, comprising:
    a housing;
    a display screen;
    a circuit board provided at the housing, the circuit board having an edge surface and a component mounting surface, wherein the component mounting surface is substantially parallel with the display screen, and the edge surface is substantially perpendicular to the display screen;
    an antenna provided at the housing in a plate shape that is substantially parallel with the edge surface and that is substantially perpendicular to the component mounting surface, wherein a width of the antenna along an axis in a first direction is substantially equal to a width of the edge surface along the axis in the first direction; and
    an antenna mounting portion provided inside the housing in a form of a rib, the antenna mounting portion to provide a space for the antenna to be provided between an inner side of the housing and a portion of the rib,
    wherein a first contact terminal formed on the edge surface and a second contact terminal formed on the antenna are electrically coupled between the circuit board and the antenna,
    wherein the antenna includes at least one side hole, and the antenna mounting portion includes at least one protrusion, and
    wherein the side hole and the protrusion to prevent the antenna from moving away from the circuit board when the antenna is provided in the space and the protrusion is provided at the side hole.

11. The portable terminal of claim 10, wherein the first contact terminal includes a spring contact that deflects when contacting the second contact terminal, and wherein the second contact terminal includes a contact pad.

12. The portable terminal of claim 10, wherein the first contact terminal includes a contact pad and the second contact terminal includes a spring contact that deflects when contacting the first contact terminal.

13. The portable terminal of claim 10, wherein the antenna does not contact the component mounting surface of the circuit board.

14. The portable terminal of claim 10, further comprising:
at least one conductive trace that is coupled to the first contact terminal and that extends across the component mounting surface of the circuit board.

15. The portable terminal of claim 10, wherein the second contact terminal is located on a first surface of a substrate of the antenna and a conductive radiator pattern is located on an opposing second surface of the antenna.

16. The portable terminal of claim 15, wherein the conductive radiator pattern is formed on a flexible printed circuit board.

17. The portable terminal of claim 10, wherein the antenna mounting portion includes an opening formed at an intermediate part of the antenna mounting portion to allow the first contact terminal at the circuit board to contact the second contact terminal at the antenna.

18. The portable terminal of claim 10, further comprising a spacer between the portion of the rib and the inner side of the housing.

19. The portable terminal of claim 10, wherein the rib includes a first portion that extends in the first direction and a second portion that extends in a second direction that is different than the first direction.

20. The portable terminal of claim 10, wherein the first contact terminal is electrically coupled to the second contact terminal when the portable terminal is in an open state, and the first contact terminal is electrically coupled to the second contact terminal when the portable terminal is in a closed stated.

21. The portable terminal of claim 10, further comprising at least one side key formed on the housing in parallel with the antenna, wherein the antenna comprises at least one contact point through which the at least one side key and the circuit board are electrically coupled.

* * * * *